United States Patent [19]
Dixon, Jr.

[11] Patent Number: 4,878,253
[45] Date of Patent: Oct. 31, 1989

[54] PLANAR MONOLITHIC MILLIMETER WAVE MIXER

[75] Inventor: Samuel Dixon, Jr., Neptune, N.J.

[73] Assignee: The United States of America as represented by the Secretary of the Army, Washington, D.C.

[21] Appl. No.: 176,125

[22] Filed: Mar. 31, 1988

[51] Int. Cl.$^4$ .............................................. H04B 1/26
[52] U.S. Cl. .................................... 455/327; 455/330
[58] Field of Search ............... 455/323, 325, 326, 327, 455/328, 330, 302

[56] References Cited

U.S. PATENT DOCUMENTS

| | | | |
|---|---|---|---|
| 4,320,536 | 3/1982 | Dietrich | 455/325 |
| 4,563,773 | 1/1986 | Dixon, Jr. et al. | 455/327 |
| 4,603,437 | 7/1986 | Dydyk et al. | 455/330 |
| 4,637,068 | 1/1987 | Crossley et al. | 455/330 |
| 4,654,887 | 3/1987 | Murphy et al. | 455/330 |

Primary Examiner—Benedict V. Safourek
Assistant Examiner—Curtis Kuntz
Attorney, Agent, or Firm—Michael Zelenka; Ann M. Knab

[57] ABSTRACT

A monolithic millimeter wave mixer. The mixer utilizes a resonant disk and two microstrip arms with in-situ Schottky diodes. A microstrip low pass filter which is gap-coupled to the disk permits isolation of the desired intermediate frequency.

1 Claim, 1 Drawing Sheet

PLANAR MONOLITHIC MILLIMETER WAVE MIXER

The invention described herein may be manufactured, used, and licensed by or for the Government for governmental purposes without the payment of any royalties thereon or therefor.

FIELD OF THE INVENTION

This invention relates generally to signal mixers and more particularly to monolithic structures employing resonant disks for millimeter wave applications.

BACKGROUND OF THE INVENTION

A mixer is a device which converts an incoming signal from one frequency to another by combining it with a local oscillator signal in a non-linear device. In general, mixing produces a large number of sum and difference frequencies. Usually the difference frequency between the signal (RF frequency) and local oscillator (LO frequency) is of interest. Mixers are often used in radar systems to convert an incoming RF frequency (from a target) to a lower intermediate (IF) frequency before further processing.

Monolithic technology has been widely used at lower frequencies (less than 30 GHz) and has proven to be attractive for addressing the problems of cost size and weight. Those concerned with the development of radars into the millimeter wave region must often deal with parts which require precise tolerances and are difficult to fabricate. There is a continuing need for low cost radar components with designs amenable to mass-production.

SUMMARY OF THE INVENTION

Accordingly, it is an object of the present invention to provide a mixing device suitable for use in high frequency communications and radar systems.

A further object of the present invention is to provide low cost mass-producible, dielectric-compatible mixing device suitable for application in modern millimeter wave radar systems.

Still another object of the present invention is to provide a signal mixer which is compatible with microstrip technology and utilizes a resonant disk.

Briefly, these and other objects are accomplished with two gallium arsenide microstrip lines having in-situ Schottky barrier diodes. A novel resonant ring disk is utilized to provide a simple circuit structure for producing the IF frequency. Output from the resonant disk is coupled to a microstrip low pass filter.

BRIEF DESCRIPTION OF THE DRAWINGS

Further objects and advantages of the present invention will become apparent to those familiar with the art upon examination of the following detailed description and accompanying drawings in which.

DETAILED DESCRIPTION OF THE PREFERRED EMBODIMENT

Figure 1:
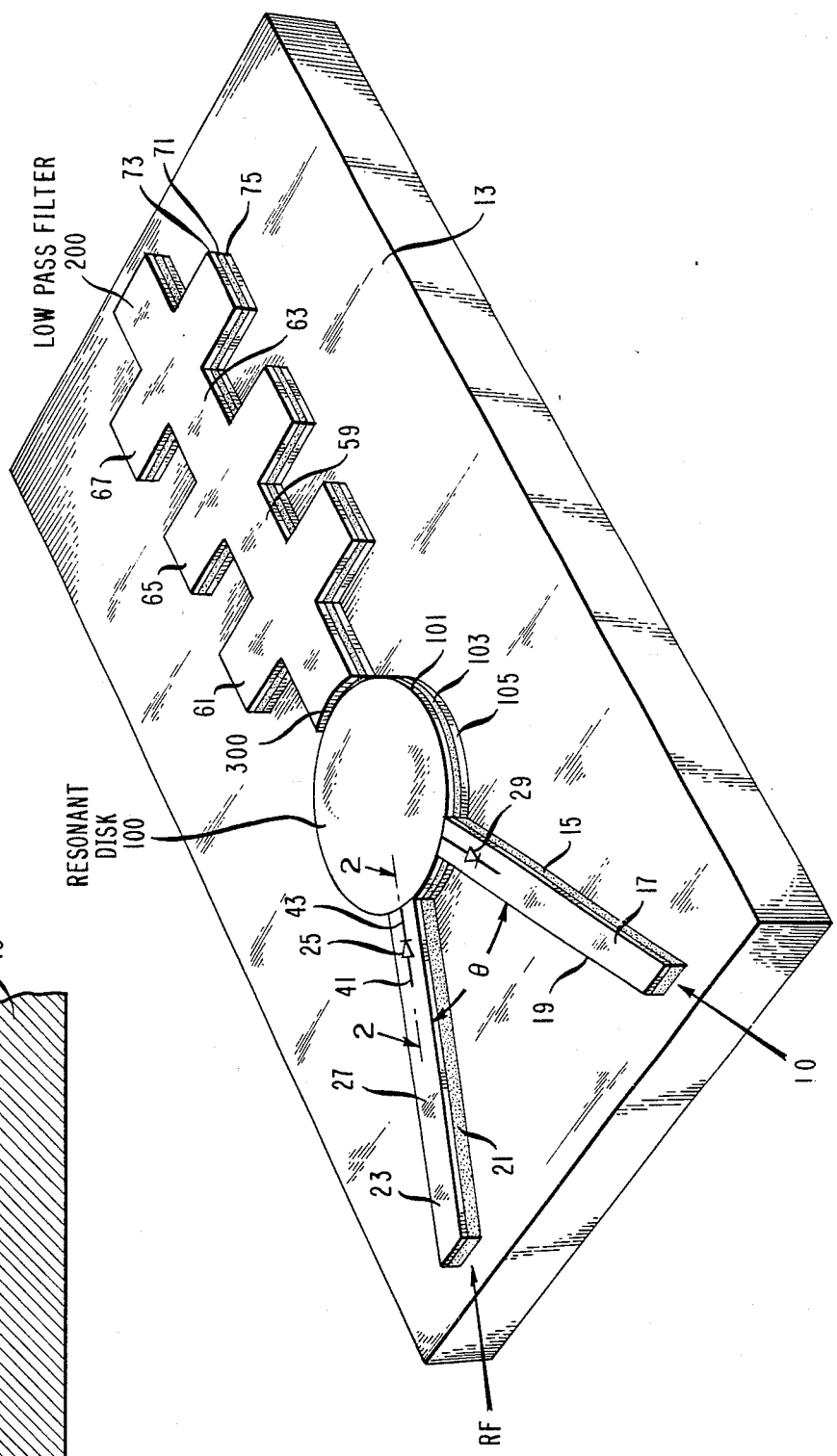
FIG. 1 is a partially perspective, partially schematic view of the inventive device.

Referring to FIG. 1, the inventive device is shown generally by reference numeral 11. Metallic ground plane is designated by reference numeral 13. Arms 27 and 19 are of microstrip construction. Arm 27 may be connected, for example, to a source of incident RF power, whereas arm 19 may be connected to the local oscillator (LO). Arm 27 contains a layer of semi-insulating gallium arsenide 21 deposited upon ground plane 13. The gallium arsenide layer 21 is covered with a conductive layer 23 which may be made preferentially from gold. Likewise, layers 15 and 17 of arm 19 are made from semi-insulating gallium arsenide and gold respectively.

Semi-insulating gallium arsenide is doped with chromium which tends to pin the Fermi level near the center of the energy band cap, thus producing a material with a high resistivity and high dielectric constant.

Both arms 27 and 19 have in-situ Schottky barrier diodes 25 and 29 respectively. It should be noted that diodes 25 and 29 are oriented in opposite directions. The opposite orientation of diodes 25 and 29 permits maximum utilization of the power from the combined RF and LO signals.

Figure 2:
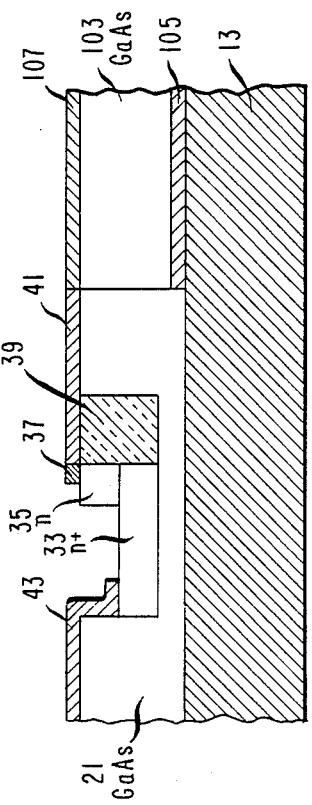
FIG. 2 is a cross-sectional view of a portion of FIG. 1 showing the details of the Schottky barrier diode construction.

The details of the construction of Schottky diode 25 can best be understood with reference to FIG. 2. Diode 25 is grown in-situ by well-known vapor phase epitaxy or molecular beam epitaxy techniques. A layer of n+ gallium arsenide material 33 is deposited within a cavity in the semi-insulating gallium arsenide material 21. A layer of n gallium arsenide material 35 is deposited upon layer 33. Layer 35 does not completely cover layer 33. A Schottky barrier is formed upon the top of layer 35 by deposition of a titanium gold composition metal 37. Layer 37 does not completely cover layer 35. A gold beam lead 41 (shown in both FIGS. 1 and 2) forms electrical contact with the titanium gold composition 37. Contact between the beam lead 41 and the n layer 35 and n+ layer 33 is prevented by dielectric 39 which is preferably silicon nitride. A second lead 43 made from ohmic metal such as gold germanium nickel alloy contacts the n+layer 33. Lead 43 is also illustrated in FIG. 1.

Resonant disk 100 has an intermediate layer 103 of semiinsulating gallium arsenide sandwiched between two gold layers 101 and 105. Disk 100 abuts arms 27 and 19. Bottom gold layer 105 contacts metal substrate 13. Beam lead 43 contacts top layer 101 of the resonant disk 100. The thickness of gallium arsenide layer 103 is between 4 to 8 mils.

Diode 29 is similar in construction to diode 25, although its orientation is reversed.

Low pass filter 200 is designed according to techniques well-known to those skilled in the art. In a preferred embodiment low pass filter 200 is made from Duroid. Duroid is the name of a trademark material which contains a dielectric material 71 between two copper sheets 73 and 75. The Duroid low pass filter may be attached to ground plane 13 by conductive epoxy. The configuration of low pass filter 200 is determined by techniques well-known to those skilled in the art. The configuration illustrated in FIG. 1 shows broad capacitive elements 61, 65 and 67 together with inductive portions 59 and 63. Low pass filter 200 permits only the desired difference frequency (IF frequency) to propagate while attenuating other undesired frequencies. Coupling between resonant disk 100 and low pass filter 200 is via the small gap 300. Gap 300 is 0.005±0.001 inches wide.

The angle theta between arms 27 and 19 is not critical. However, the angle theta should be no smaller than one-quarter the guide wave length in the microstrip material lest cross-talk occur.

The illustrative embodiment herein is merely one of those possible variations which will occur to those skilled in the art while using the inventive principles contained herein. Accordingly, numerous variations of invention are possible while staying within the spirit and scope of the invention as defined in the following claims and their legal equivalents.

What is claimed is:

1. A monolithic waveguide mixer device comprising:
a pair of arms connected respectively to a source of incident RF power and a local oscillator; said arms containing a layer of semi-insulating gallium arsenide deposited upon a metallic ground plane and covered with a conductive layer; said arms having in-situ Schottky barrier diodes monolithically integrated in the arms such that said diodes are oriented in opposite directions respective to one another; and a resonant disk abutting said arms and composed of a layer of semi-insulating gallium arsenide sandwiched between two gold layers; said arms separated by angle theta ($\theta$) such that theta ($\theta$) should be no smaller than one-quarter the guide wavelength; and said resonant disk gap-coupled to a low-pass filter.

* * * * *